United States Patent [19]

Spiecker

[11] Patent Number: 4,760,948
[45] Date of Patent: Aug. 2, 1988

[54] LEADLESS CHIP CARRIER ASSEMBLY AND METHOD

[75] Inventor: Ray G. Spiecker, Westford, Mass.
[73] Assignee: RCA Corporation, Princeton, N.J.
[21] Appl. No.: 65,611
[22] Filed: Jun. 23, 1987

Related U.S. Application Data

[63] Continuation of Ser. No. 945,686, Dec. 23, 1986, abandoned.

[51] Int. Cl.⁴ .................... H05K 13/04; H05K 3/34
[52] U.S. Cl. ........................... 228/180.2; 219/85 BM
[58] Field of Search ............... 174/52 FP; 228/122, 228/123, 124, 188, 180.2; 219/85 BA, 85 BM

[56] References Cited

U.S. PATENT DOCUMENTS

| | | | |
|---|---|---|---|
| 3,458,925 | 8/1969 | Napier et al. | 228/180.2 |
| 3,486,223 | 12/1969 | Butera | 219/85 BM |
| 3,522,407 | 8/1970 | Costello | 219/85 BA |
| 3,591,839 | 7/1971 | Evans | 174/52 FP X |
| 3,829,601 | 8/1974 | Jeannotte et al. | 361/411 X |
| 4,195,195 | 3/1980 | Miranda et al. | 361/409 X |
| 4,475,007 | 10/1984 | Ohno | 174/52 FP |
| 4,545,610 | 10/1985 | Lakritz et al. | 174/68.5 X |
| 4,581,680 | 4/1986 | Garner | 174/68.5 X |
| 4,600,970 | 7/1986 | Bauer | 174/52 FP X |

OTHER PUBLICATIONS

"Soldering Techniques for Surface Mounted Leadless Chip Carriers," by: R. G. Spiecker et al., presented at Int'l. Society for Hybrid Microelectronics (ISHM), Atlanta, GA, Oct. 6-8, 1986.
"Development of a New Micro-Solder Bonding Method for VLSI's," by R. Satoh et al., IEPS Proceedings, 1983, pp. 455-461.

*Primary Examiner*—Kenneth J. Ramsey
*Attorney, Agent, or Firm*—Allen E. Amgott; Raymond E. Smiley; Joseph S. Tripoli

[57] ABSTRACT

A leadless ceramic chip carrier (LCCC) is soldered to mating conductor pads on a circuit board by depositing a layer of solder paste on peripheral contact pads and on an array of central pads on the board. The same solder paste type and melt temperature are used for both peripheral and central pads. the contact pads of the LCCC are placed on the solder layers and the assembly exposed to infrared radiation from above or other energy source. The LCCC body shades the solder on the central pads resulting in the solder layers at the peripheral pads melting first. The solder on the central pads then melts and balls up due to surface tension lifting the LCCC away from the board stretching the melted solder at the peripheral pads which make the electrical connections to the LCCC contacts.

6 Claims, 1 Drawing Sheet

LEADLESS CHIP CARRIER ASSEMBLY AND METHOD

This invention was made with Government support under contract No. DAAL01-85-C-0633 awarded by the Department of the Army. The Government has certain rights in this invention.

This application is a continuation Ser. No. 945,686, filed Dec. 23, 1986 and now abandoned.

This invention relates to the soldering of leadless chip carrier (LCC) pads to circuit board substrate pads.

Leadless chip carriers are sometimes referred to as surface mounted devices (SMDs). These devices are relatively small, have numerous contact pads at the peripheral edges, and are the subject of a great deal of study, of late, with respect to soldering the contact pads thereof to mating contact pads on circuit board substrates. Soldering problems include cleanliness, good solder joints, and stress fatigue failures of the solder joints.

Solder flux tends to be trapped in the region between the device body and the substrate, the flux being corrosive, and, therefore, being undesirable. Also, the soldering process tends to splatter somewhat, producing microscopic solder balls in the region between the device and the substrate, which can be the source of short circuits and contamination. Because of the small size of the device and their solder connections, and the spacing therebetween, it is difficult to clean the spaces between the connections. As a result, shorts between the contact pads on the device and on the substrate sometimes occurs.

Solder joint failures caused by temperature differences between the LCC and the substrate and by mechanically induced strains are another major problem. By increasing the solder joint height (i.e., the separating distance between LCC and substrate), fatigue failures can be reduced because a tall solder connection becomes a compliant interconnection which can bend somewhat when stressed, and therefore not fracture as soon.

An article by the present inventor and Demetrios Haggis, entitled "Soldering Techniques for Surface Mounted Leadless Chip Carriers," presented at International Society for Hybrid Microelectronics (ISHM), Atlanta, Ga., Oct. 6-8, 1986, discusses different soldering techniques for SMDs, including the present invention.

The present invention is an improvement over a process and assembly disclosed by R. Satoh et al., entitled "Development of a New Micro-Solder Bonding Method for VLSI's," IEPS Proceedings, 1983. Disclosed in the Satoh et al. article is a micro-solder bonding method referred to as "self-stretching technique" (SST). The purpose of this technique is to provide solder joints which are relatively free of thermal cycle fatigue damage. In this SST process, control-solder sheets, whose melting temperature is higher than that of the bonding solder bumps which serve to connect the lead pads of the device to corresponding contact pads on the substrate, are placed between the chip and substrate. When the chip and substrate are heated, the solder bumps melt first and create a joint between the chip contact pads and the substrate contact pads.

After formation of the contact pad joints, the control-solder sheets melt due to their higher melting temperature and take on a somewhat spherical shape due to surface tension. The mass of the control sheets is larger than the mass of the individual solder connections for the solder contact pads. During the formation of the spherical shape, the spherical mass, in response to its surface tension, pushes the device upward elevating the chip body over the substrate. The article states that the hourglass shaped solder connections at the contact pads exhibit very high reliability in regard to thermal cycle fatigue life and are relatively stress free.

The problem with the disclosed Satoh et al. technique is that two different solder compositions are required because the solder connections for the lead pads are required to melt prior to the melting of the control solder sheet. The control solder sheet has a higher melting temperature than the contact solder pad solder melting temperature for this purpose and, therefore, the process requires depositing two different compositions of solder on the contact pads for each SMT. This can be relatively cumbersome and difficult to implement in a factory environment.

A leadless chip carrier (LCC) assembly according to the present invention comprises an LCC device having a peripheral first array of spaced contact pads on a surface thereof. A substrate has a second array of spaced contact pads juxtaposed in spaced facing relation with the first array of spaced contact pads. Each contact pad of the first array is juxtaposed with and corresponds to a different contact pad of the second array to form a contact pad pair. A plurality of solder connections of a given volume and composition connect the contact pads of each contact pad pair. At least one central pad is provided on at least the substrate and is located symmetrically within and relative to the second array of spaced contact pads. At least one central solder mass abuts the LCC device and is secured to the at least one central pad, has a volume greater than the given volume and comprises the same solder composition as the solder connections.

In fabricating this assembly, the LCC is exposed to thermal energy so that the LCC body initially shades the central portion from the energy. This shading action tends to permit the solder paste at the peripheral array of contact pads to melt initially prior to the melting of the solder paste at the central pad, even though both solder pastes have the same melt temperature. The solder at the central pad, when melted, tends to form a ball to thereby lift the LCC and stretch the melted connection solder at the peripheral array of contact pads.

Figure 1:
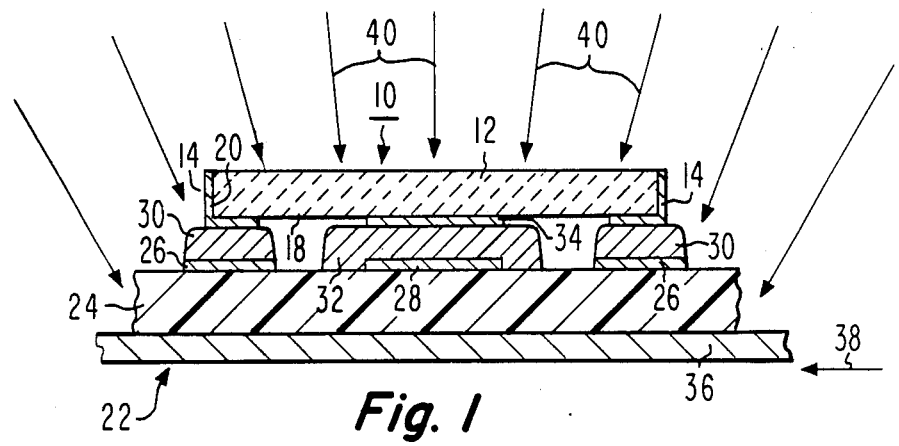
FIG. 1 is a sectional elevation view of an LCC prior to being soldered in accordance with one embodiment of the present invention.

In FIG. 1, device 10 is a leadless ceramic chip carrier (LCCC) of conventional design. Device 10 has a ceramic body 12 and an integrated circuit connected to an array of contact pads 14 spaced about the body 12 periphery. The contact pads 14 are L-shaped in which one leg is on the body bottom surface 18 and a second leg attached to the body side walls 20. There are a large number of contact pads 14 extending about the body 12 in rectangular or square array, depending upon the shape of the body.

Circuit board 22 comprises a dielectric substrate 24 on which are a plurality of rectangular electrically conductive contact pads 26. Each contact pad 26 corresponds to and is aligned with a different LCCC contact pad 14. A central square metallic pad 28 is symmetrically within the array of contact pads 26. Pad 28, unlike pads 26, is not electrically connected to a circuit. The pad 28 has a given area which is larger than the area of any one of the contact pads 26. In the alternative, pads 28 may be circular and circular pads may be attached to surface 18 in place of pads 14.

A solder paste of a given composition, for example, 62-36-2, i.e., 62% tin, 36% lead, and 2% silver, which has a melting temperature of about 179° C., is deposited in a layer of a uniform thickness on the contact pads 26 and pad 28. There is a layer 30 of solder paste on each contact pad 26. Layer 32 of solder paste on pad 28 has the same thickness as layers 30 and the same solder composition and thus the same melt temperature. Layer 32 covers the pad 28 and beyond for an extent of about at least twice the area of pad 28. The thickness of paste layers 30 and 32 lies in a range of about 10–30 mils and preferably is about 15 mils.

In the central region of body 12 is a metallic pad 34 which is optional. Pad 34 is juxtaposed and spaced above pad 28 on substrate 24. Pad 34 is about the same area and shape as pad 28.

The assembly, as described, is placed on a support 36 which may be a conveyor which moves in direction 38. The conveyor moves the circuit board 22 and the carried LCCC beneath a set of infrared radiation sources (not shown) which irradiate infrared rays 40 onto the assembly passing therebelow for a given time period. Because the layers 30 and 32 are of the same thickness and of the same solder composition, and, therefore, have the same melting point, the solder layers 30 at the edges of the LCCC 10 are exposed to immediate irradiation by rays 40 for a sufficient time to reach their melting temperature before layer 32. The layer 32 reaches its melting temperature thereafter because layer 32 is in the shadow of the body 12 and, therefore, does not receive direct irradiation of rays 40. The rays 40, however, heat up the body 12 relatively quickly and in a matter of seconds after the melting of layers 30, the layer 32 reaches its melting point and also melts.

Figure 2:
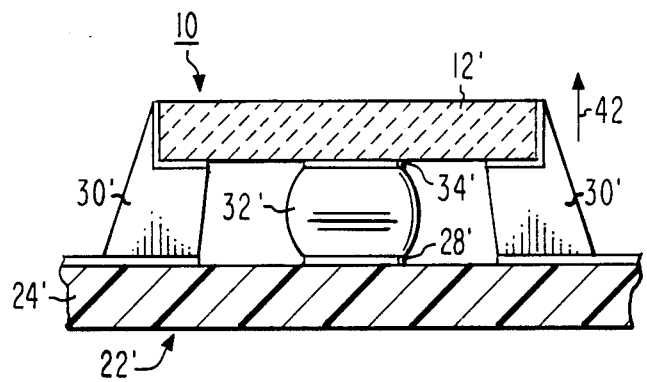
FIG. 2 is a sectional elevation view of the assembly of FIG. 1 after the soldering operation is completed.

As discussed in the Satoh et al. article, it is important that the connection layers 30 melt first so that there is a good solder connection between the pads 14 of the LCCC and pads 26 of the circuit board 22. After the outer peripheral solder layers 30 melt, the inner layer 32 then melts and tends to ball up into a somewhat square barrel-like shape, as shown in FIG. 2. In FIG. 2, the surface tension on this balled-up mass of solder tends to lift the body 12' in direction 42 away from the circuit board 22. This barrel-like mass 32' of molten solder reaches this shape due to surface tension, as discussed more fully in the Satoh et al. article. The mass 32' of solder is confined by the area of the pads 28' and 34' on the circuit board 22' and body 12', respectively. The lifting action of the LCCC device 10' in direction 42 stretches molten solder 30'. This stretches the molten solder 30' into relatively tall, more compliant connections. The lifting action must take place after the connections 30' are melted so that these melted connections may stretch and reshape into the tall configuration. The shape of the solder connections 30 can be made to be any desired shape by selecting the size and shape of pads 26 and the amount of the printed solder paste.

By providing all of the solder joints with a composition of solder having the same melting temperature, a simplified construction is provided which enables the LCCC devices to be assembled in a practical manner in a factory environment. Only a single solder paste composition need be screened onto the contact pads of the circuit board for all LCCCs to be mounted.

The area of layer 32, FIG. 1, is preferably at least double and may be three times the area of the contact-like pads 28 and 34. This relative relationship of the area of the solder to the contact-like pads is important to provide a sufficient mass of molten solder to achieve the lifting action discussed above in connection with FIG. 2. In the above embodiment, a single central solder mass 32' is discussed. However, in FIG. 3, an LCCC device 50 may be secured to circuit board 52 with an array of four central square solder masses 54. The masses 54 are symmetrical relative to the area defined by the contact pads 56 of the circuit board 52. The four solder masses 54 tend to provide uniform lifting action of the device 50 to provide uniform stretching of the solder connections 58.

It is preferable in the present embodiment that a central pad (or pads) 34, FIG. 1, be provided on the LCCC device 10. While such a central pad is optional, it is believed that omission of such a pad will result in capturing of flux puddles between the molten solder mass and the body 12 after melting of the central layer such as layer 32. The accumulation of solder flux puddles is eliminated by providing central pad 34 on the body 12. The lifting action of the body 12', FIG. 2, separates the body from the circuit board substrate to prevent shorts from solder balls, permits ease of cleaning of the region between the device and the substrate, and tends to avoid other problems as might occur when the LCCC is closely spaced to the substrate.

Figure 4:
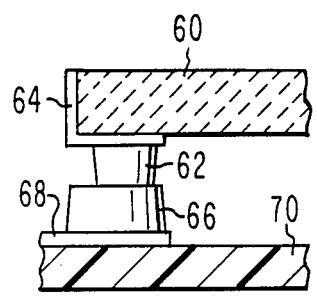
FIG. 4 is a sectional elevation view of an LCC assembly in accordance with a third embodiment.

In the alternative, in FIG. 4, LCCC device 60 may have layer 62 of solder paste deposited on its contact pads 64. Layer 62 is screened onto the device in a separate process. A second layer 66 of solder paste is deposited on contact pads 68 of circuit board 70. The total elevation of the LCCC device 60 above the circuit board 70 is the combined thicknesses of layers 62 and 66 and contact pads 64 and 68 which is within the 10–30 mil range discussed above. After melting of the solder paste layers, the boiling off of liquids in the solder paste shrinks the spacing between the LCCC and the circuit board substrate somewhat so that the final molten solder spacing is about 12 mils. The 12-mil spacing is greater than would occur were it not for the central solder mass elevating the LCCC relative to the circuit board substrate, otherwise the spacing would shrink.

Figure 3:
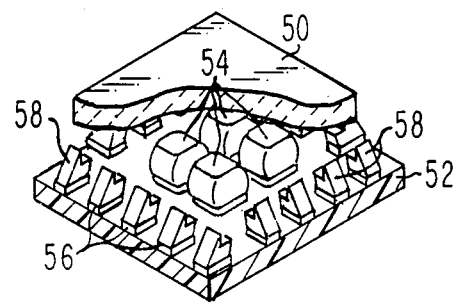
FIG. 3 is an isometric, partially fragmented view of an LCC assembly in accordance with a second embodiment of the present invention.

By way of example, the central pads corresponding to central solder masses 54, FIG. 3, may be 0.1×0.1 inch copper conductors overprinted with a solder paste over a region 0.17×0.17 inch which approximates a region that is three times the area of the central pad area. During reflow when the solder paste layers are melted, the solder surface tension draws the excess solder from the peripheral regions of the central pads into the 0.1×0.1 inch region and pushes the body 50 upward, achieving an automatic 12-mil height. While a number of contact pads are illustrated and the thicknesses of the solder paste designated, these are given by way of illustration rather than limitation. It does not matter whether the contact pads of the circuit board substrate or the contact pads of the LCCC are precoated with solder paste layer. Also, the number of central pads may vary from that shown in accordance with a given implementation. Further, LCC devices of non-ceramic material as well as LCCC devices may be assembled as discussed herein. LCCs with L-shaped pads have been illustrated, however, this technique is useable with LCC pads without the side leg. The central solder connections, FIG. 2, from LCCC pad 34' through the solder 32' to the substrate pad 28' provide a low thermal resistance path which helps keep the LCCC body 12' and the substrate 22' at the same temperature, further reducing stresses from thermal gradients.

In a vapor phase soldering process, it is believed that the peripheral solder contacts 30' will melt before the central solder mass 32' because the hot vapor encounters the peripheral pads first and a short time later the vapor travels under the LCCC body 12' to encounter the central solder mass 32'. The time difference and the difference in the mass of the peripheral and central solder amounts allow the peripheral pads to reflow first.

What is claimed is:

1. A method of connecting a leadless chip carrier (LCC) to a substrate, said chip carrier having a like array of metallic pads, said substrate having a like array of metallic pads corresponding to the peripheral pads and at least one central metallic pad, said method comprising:
   depositing on each said substrate pads corresponding to the peripheral pads a layer of solder paste of a given composition and thickness;
   depositing on said at least one central pad a layer of said solder paste of said thickness over an area of at least about double the area of said central pad; and
   applying thermal energy to said LCC so that the LCC shades said central pad and its layer of solder paste from the thermal energy to melt the solder paste at said peripheral array of pads prior to the melting of the solder paste at said central pad, said solder at said central pad tending to form a ball to thereby lift the LCC and stretch the melted solder at said peripheral array of pads.

2. The method of claim 1 further including depositing a layer of said solder paste on said LCC pads.

3. The method of claim 1 wherein said thickness is in the range of about 10-30 mils.

4. The method of claim 1 wherein said at least one central pad comprises a symmetrical array of at least four pads, each of larger area than the areas of the pads of said peripheral array, said method comprising depositing a layer of said solder paste on each said at least four pads of said given thickness, each layer over an area of about double the area of the corresponding one of said at least four pads.

5. The method of claim 1 wherein said applying thermal energy includes exposing said LCC to infrared radiation for a given time interval.

6. A method of soldering an LCC device to contacts on a substrate wherein the LCC device and substrate each have an outer array of contact pads and at least one central metallic pad, said method comprising:
   coating said pads of at least the substrate with a layer of solder paste of a given composition and thickness;
   coating said at least one pad of at least the substrate with a layer of said solder paste of said given composition and thickness over an area greater than the area of said at least one pad; and
   applying thermal radiation onto said LCC so that the LCC shades the at least one central pad from the radiation so that the solder paste on the at least one central pad melts after the solder paste on the outer array of contact pad melts.

* * * * *